United States Patent
Schmidt et al.

(10) Patent No.: US 7,180,440 B2
(45) Date of Patent: Feb. 20, 2007

(54) INTEGRATED CIRCUIT FOR A RADAR DEVICE IN A HERMETICALLY SEALED HOUSING COMPRISING A PATCH ANTENNA FORMED FROM A BENT COMPONENT FROM SHEET METAL

(75) Inventors: Ewald Schmidt, Ludwigsburg (DE); Heinz Pfizenmaier, Murrhardt (DE); Steffen Leutz, Sinheim (DE); Hans Irion, Winnenden (DE); Juergen Hasch, Uhingen (DE)

(73) Assignee: Robert Bosch GmbH, Stuttgart (DE)

( * ) Notice: Subject to any disclaimer, the term of this patent is extended or adjusted under 35 U.S.C. 154(b) by 111 days.

(21) Appl. No.: 10/482,496

(22) PCT Filed: Jan. 26, 2002

(86) PCT No.: PCT/DE02/00273

§ 371 (c)(1),
(2), (4) Date: Jan. 31, 2005

(87) PCT Pub. No.: WO02/063334

PCT Pub. Date: Aug. 15, 2002

(65) Prior Publication Data
US 2005/0128122 A1    Jun. 16, 2005

(30) Foreign Application Priority Data
Feb. 3, 2001   (DE) ................. 101 04 862
Feb. 3, 2001   (DE) ................. 101 04 865

(51) Int. Cl.
*G01S 7/28*   (2006.01)
(52) U.S. Cl. .................. 342/22; 342/175
(58) Field of Classification Search .......... 342/22, 342/175
See application file for complete search history.

(56) References Cited

U.S. PATENT DOCUMENTS 5,477,231 A    12/1995   Medard ............... 343/700 MS (Continued)

FOREIGN PATENT DOCUMENTS

DE    41 30 493 A    3/1993

(Continued)

OTHER PUBLICATIONS

Patent Abstracts Of Japan vol. 018, No. 464 (E-1598), Aug. 29, 1994 & JP 06 152237 A, May 31, 1994.

(Continued)

*Primary Examiner*—Dan Pihulic
(74) *Attorney, Agent, or Firm*—Michael J. Striker

(57)   ABSTRACT

A compact radar device that can be produced with little complication has at least one cavity (3) with a radiation element (10) disposed therein and a shielded chamber (2) for electrical circuits (4). A housing (1) is designed in such a manner that it defines both the shielded chamber (2) for the electrical circuits (4) and the at least one cavity (3) for the at least one antenna radiation element (10). A printed board (5) carries the electrical circuits (4) and is inserted into the housing (1) between the two chambers (2, 3) as a shielding partition. The antenna radiation element (10) is electrically coupled to the two conductor arms to a feed network on the printed board (5) via contact pins (16, 19).

15 Claims, 2 Drawing Sheets

U.S. PATENT DOCUMENTS

| | | | |
|---|---|---|---|
| 5,764,189 A | 6/1998 | Lohninger | 343/700 MS |
| 6,501,415 B1* | 12/2002 | Viana et al. | 342/175 |
| 2002/0135508 A1* | 9/2002 | Kleman | 342/124 |

FOREIGN PATENT DOCUMENTS

| | | |
|---|---|---|
| EP | 0 989 628 A | 3/2000 |
| WO | 96/19737 | 6/1996 |

OTHER PUBLICATIONS

Herscovici, N.: "New Considerations In The Design Of Microstrip . . . ", IEEE Transactions On Antennas And Propagation, IEEE Inc. New York, US, BD. 46, NR. 6, Jun. 1, 1998, pp. 807-812.

* cited by examiner

INTEGRATED CIRCUIT FOR A RADAR DEVICE IN A HERMETICALLY SEALED HOUSING COMPRISING A PATCH ANTENNA FORMED FROM A BENT COMPONENT FROM SHEET METAL

BACKGROUND OF THE INVENTION

CROSS-REFERENCE

The invention described and claimed hereinbelow is also described in PCT/DE02/00273, filed on Jan. 26, 2002 and DE 101 04 865.3, filed Feb. 3, 2001 and DE 101 04 862.9, filed Feb. 3, 2001. This German Patent Application whose subject matter is incorporated here by reference, provides the basis for a claim of priority of invention under 35 U.S.C. 119 (a)–(d).

The present invention relates to a radar device, preferably for the detection of objects enclosed in a wall, that includes a transmit and receive antenna arrangement, composed of at least one cavity with a radiation element disposed therein and a shielded chamber for electrical circuits, whereby the shielded chamber is formed by a printed board that is covered with a housing. The electrical circuits are installed on the side of the printed board facing the interior of the housing, and the antenna arrangement is installed on the other side A radar device of this type is made known in WO 96/19737. Using a radar device, objects enclosed in a wall or in the earth, for instance, can be detected with high precision. In order to protect objects that are enclosed in a wall—e.g., steel supports, power lines, water lines and the like—from being destroyed when drilling is performed in the wall, the tradesman should be provided with precise information about the location, i.e., the directional position on the wall surface and the depth in the wall, of the enclosed object. As described in WO 96/19737 as well, a radar device is typically composed of a "front end", i.e., a transmitter/receiver unit, and a display device. As described initially, the front end disclosed in WO 96/19737 includes a shielded chamber for electrical circuits and two chambers adjacent to this chamber that are designed as transmit and receive antenna. The cavities for the transmit and receive antenna are configured in the shape of horns, in which radiation elements (e.g., in the form of wires) are installed. The chamber in which the electrical circuits are housed is shielded by a housing that is placed on the printed board for the electrical circuits and by the walls of the antenna horns, which are fixed in position on the side of the printed board opposite to the electrical circuits. The embodiment of the front end of a radar device described in the publication WO 96/19737 is relatively costly to fabricate, because it is composed of a large number of individual parts.

A transmission line used as an electrical connection between a planar antenna and a planar conductor on a printed board is made known in the paper authored by M. Herscovici, "New Considerations in the Design of Microstrip Antenna", IEEE Transactions on Antennas and Propagation, Vol. 46, No. 6, June 1998, pp. 807–812. The planar antenna according to M. Herscovici is positioned at a certain distance above the printed board, and is composed of a conductive plate (patch) that serves as a radiation element. The transmission line extends from the edge of said conductive plate (patch) to a planar conductor on the printed board. The conductor arm of the transmission line can be interconnected with the radiation element of the antenna as one piece. The other end of the conductor arm, which is referred to as a 3-D transition in the paper, has a contact base on its end that rests on the printed board, which said contact base can be soldered to the planar conductor, for example. The contact base that rests on the printed board is not capable of providing the transmission line with high mechanical stability. In particular, due to the type of fixation and contacting on the printed board described in the paper, said transmission line is not capable of holding a planar antenna joined with it with adequate stability. An additional supporting post is therefore required for the planar antenna.

The present invention is based on the object of providing a radar device of the type described initially, which is compact in design and can be produced with as little complication as possible, but which can be realized with high stability, of the antenna element in particular, whereby good electrical transmission properties are desired.

SUMMARY OF THE INVENTION

The stated object is attained by providing a single housing that defines both a shielded chamber for electrical circuits and at least one cavity for at least one antenna radiation element. A shielding partition between the two chambers is formed by a printed board, on one side of which the electrical circuits are carried, and on the other side of which the antenna arrangement is installed. To assemble the front end of a radar device, one only needs a printed board on which the electrical circuits and at least one radiation element of an antenna arrangement are pre-installed, which can then be inserted in a housing. The features according to the invention not only simplify production, they save materials as well, because the electrical circuits and the antenna arrangement are located in a common housing, which renders separate housing arrangements for the electrical circuits and the antenna arrangement unnecessary.

In advantageous fashion, a shoulder that serves as a base and for the securing of the printed board is integrally molded on the housing.

In advantageous fashion, the housing includes at least one exit and entrance opening for radar beams on the side of the at least one antenna cavity opposite to the printed board, and this opening is closed with a dielectric plate that is passable by the radar beams.

Production advantages are obtained when the housing is configured as one piece, and the housing is composed of metal or a metallized plastic.

The electromagnetic shield between the two chambers may be realized in simple fashion via a metallized layer on or in the printed board.

An easily producible radiation element preferably is stamped out of sheet metal, with a section that is oriented nearly parallel to the printed board, and sheet-metal segments are angled outward from said section on two diametrically opposed edges, which serve as conductor arms for coupling the radiation element to a feed network on the printed board and as spacers for the flat section above the printed board.

In order to provide greater stability for the radiation element in its cavity, it is advantageous to locate one or several springy tabs on the edges of the flat section of the radiation element, which said tabs provide support for the radiation element against a dielectric plate that is passable by radar beams and covers said radiation element.

The conductor arms for coupling the radiation element to a feed network on the printed board advantageously include, on their end that is contactable with the printed board, one or several pins that are oriented substantially perpendicular to the plane of the printed board and are capable of being inserted in openings provided therein, and that are capable of being contacted with the planar conductor. The pins that are capable of being inserted in the openings of the printed board provide the conductor arm with very high mechanical stability. In addition, the pins may be soldered in the openings using a simple procedure, thereby enabling a permanent contact between the transmission line and a planar conductor on the printed board that has low susceptibility to interference.

An improvement in the electrical contact between the transmission line and the planar conductor, and in the mechanical stability of the transmission line, can be obtained by providing at least one further pin that extends from the conductor arm, which said pin is angled outward perpendicularly relative to the other pin(s), so that it rests on a conductive track of the planar conductor when the conductor arm is inserted into the printed board, and is therefore contactable. Advantageously, two pins capable of being inserted in openings in the printed board are provided on the conductor arm and, between these two pins, a further pin is provided that is angled outward perpendicularly relative to said two pins.

The transmission line, which is composed of the conductor arm and the contacting means, can be configured as a single-component part that is preferably made from a piece of sheet metal.

The transmission line according to the invention may be used in advantageous fashion for an electrical and mechanical connection between a printed board and a planar antenna that is located at a distance above the printed board.

BRIEF DESCRIPTION OF THE DRAWING

The invention is described in greater detail hereinbelow with reference to the exemplary embodiment presented in the drawing.

DETAILED DESCRIPTION OF THE PREFERRED EMBODIMENTS

Figure 1:
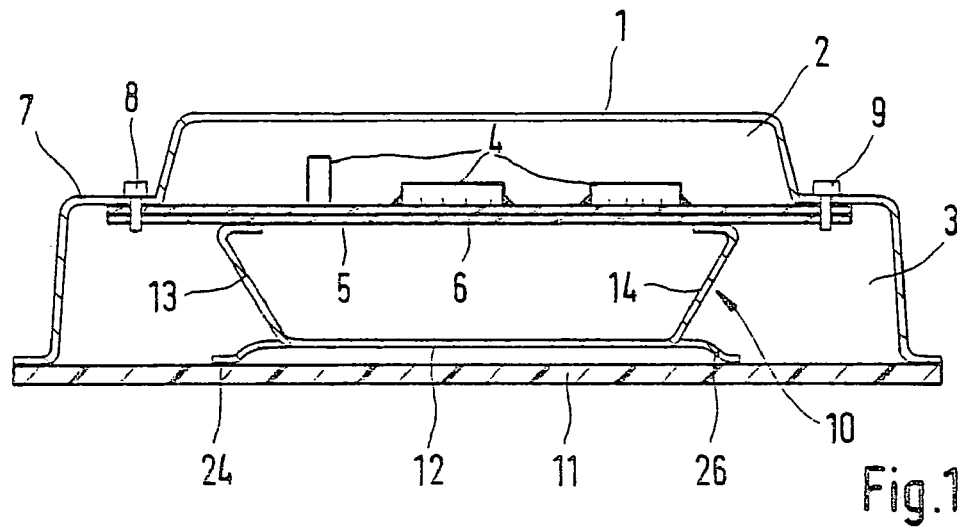
FIG. 1 is a longitudinal sectional drawing through the front end of a radar device.

FIG. 1 shows a longitudinal sectional view through a "front end" of a radar device that is designed to detect objects enclosed in a wall. When reference is made in the application to "objects enclosed in a wall" that are to be located with the radar device, the use of the radar device is not limited to walls; it also includes other comparable areas, such as ceilings or floors. In addition to the front end, a radar device typically has a display part, on which location information about an object located in a wall can be displayed. The display unit will not be described in greater detail here, because it is not a subject of the invention. The "front end" refers to the part of the instrument in which all transmit and receive devices are housed. Electrical circuits, e.g., digital signal processors, for processing the receive signals, can also be located in the front end, or they can be housed in a separate part of the instrument.

The front end of the radar device includes a housing 1, in which all parts belonging to the front end are housed together. The front end is composed substantially of two assemblies. One assembly is composed of electrical circuits for processing high-frequency signals or low-frequency signals or digital signals. The second assembly of the front end is composed of a transmit and receive antenna arrangement. The two stated, different assemblies are housed in separate chambers 2 and 3 of housing 1, which said chambers are shielded against electromagnetic radiation. Housing 1 is designed in such a manner that the two chambers 2 and 3 are in a stacked arrangement. Electrical circuits 4 are housed in upper chamber 2, whereby said electrical circuits 4 are located on a printed board 5. Said printed board 5 is fixed in position in housing 1 at its edges, and is a partition that shields chamber 2 against electromagnetic radiation from chamber 3, which is located beneath printed board 5. In order to ensure that chamber 2 is shielded electromagnetically from chamber 3, printed board 5 is equipped with one or several metallized layers. Said at least one metallized layer can be applied to the outside of the printed board, or it can extend in the interior of printed board 5. In the exemplary embodiment shown in FIG. 1, a shielding metallic layer 6 of this type is located in the interior of printed board 5.

A simple possibility for fixing printed board 5 in position in housing 1 is provided by integrally molding a peripheral shoulder 7 on housing 1. Said shoulder 7 provides housing 1 with a stepped shape, as shown in the longitudinal sectional view in FIG. 1. The extensions of chambers 2 and 3 that are arranged in a stacked configuration therefore have different lengths. The edge of printed board 5 rests on shoulder 7, where it can be secured with fastening elements (e.g., screws, rivets) 8, 9 or by soldering or adhesive bonding or other suitable fixing means.

Cavity 3 located under printed board 5 serves as a transmit and receive antenna. A radiation element 10 that belongs to the transmit and receive antenna is located in cavity 3, is secured on the side of printed board 5 that is opposite to electrical circuits 4, and is electrically contacted with a not-shown feed network. In the simplest case, the feed network is composed, for example, of a microstrip fork, via which an electrical connection is established between the antenna and the transmit and receive circuits. In the exemplary embodiment shown, there is one antenna with a single radiation element 10 that transmits and receives radar beams. In deviation thereof, a transmit antenna and a receive antenna can be configured separate from each other. Cavity 3 would then be subdivided into two sub-chambers, each of which would be equipped with its own radiation element.

Housing 1 is open on the bottom, where radar beams enter and exit. Said opening is closed with a dielectric plate 11 that is passable by the radar beams and has the function of a radome. If the transmit antenna and the receive antenna were located in adjacent cavities, separate from each other, each of said adjacent sub-chambers would be equipped with an opening that would be closed, advantageously, with a dielectric plate. The connection of housing 1 with dielectric plate 11 may be realized in very different fashions. Connecting means can be screws, rivets, adhesive bonding agents, solder or the like. Additional fastening means for dielectric plate 1 can be integrally molded on housing 1 as well.

Figure 2:
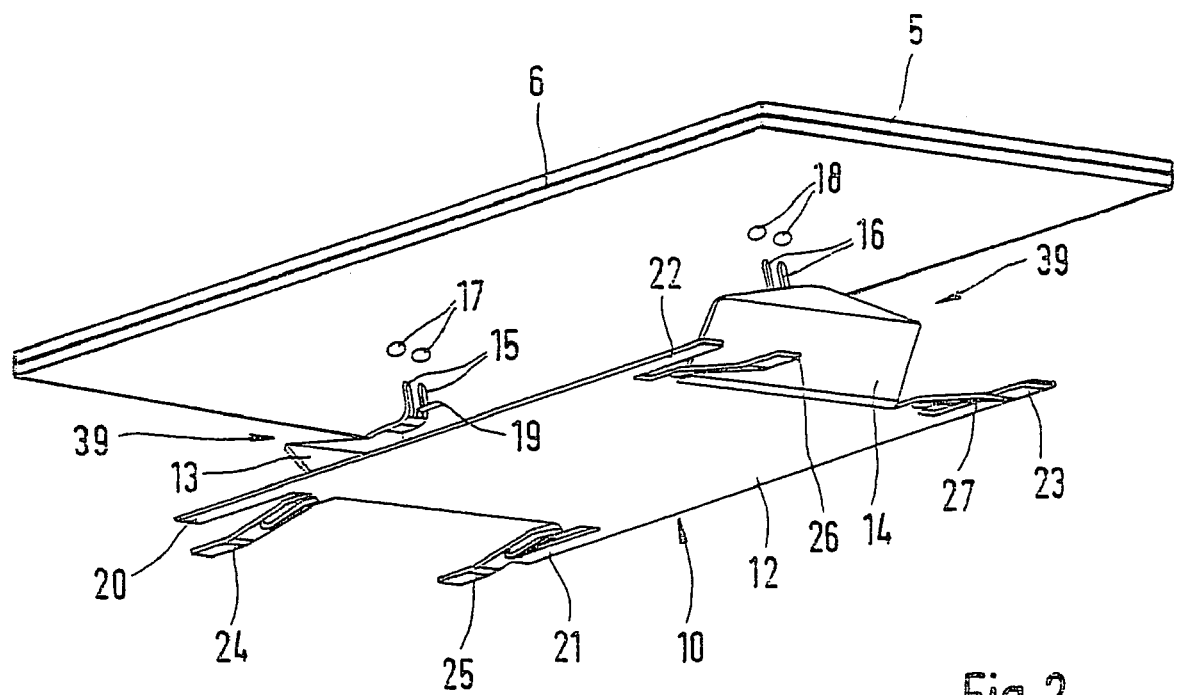
FIG. 2 is a perspective representation of a radiation element that is insertable in the front end.

FIG. 2 is a perspective representation of a special exemplary embodiment of a radiation element 10 under printed board 5. Radiation element 10 is composed of a flat section 12 that is oriented substantially parallel to printed board 5. Flat section 12 can have a rectangular shape (as shown in FIG. 2); it can also have a round, oval or similar shape. In order to reduce fabrication cost to the minimum, the radiation element is preferably produced as a part stamped out of sheet metal.

Two sheet-metal segments 13 and 14 are angled outward from two diametrically opposed edges, which said segments serve as conductor arms for coupling radiation element 10 to a not-shown feed network on printed board 5, and as spacers for flat section 12 over printed board 5. The bent ends of sheet-metal segments 13 and 14 bear against printed board 5. Contact pins 15,16 are provided on the ends of angled sheet-metal segments 13 and 14, which said contact pins are insertable in associated openings 17, 18 in printed board 5 and are contactable there with correspondings conductive tracks of a feed network.

Via this type of connection between radiation element 10 and printed board 5, an electrical contact with a feed network is established, and radiation element 10 is secured to the underside of printed board 5. In addition to contact pins 15 and 16, an additional solder tail 19 (as seen on the end of sheet-metal segment 13) can be provided on the ends of sheet-metal segments 13 and 14, which can be soldered on a conductive track on the underside of printed board 5.

Flat section 12 of radiation element 10 is held by sheet-metal segments 13 and 14, acting as spacers, at a certain distance above printed board 5 that carries a feed network. Therefore, a dielectric with a very low dielectric constant, namely air, is located between flat section 12 and printed board 5, which makes a very broadband operation of the antenna possible.

The bandwidth of the antenna can be optimized, as shown in FIG. 2, by providing flat section 12 with tab-like extensions 20 through 27 in addition to conductor arms 13 and 14. In the exemplary embodiment shown, two extensions 20, 24; 21, 25; 22, 26; 23, 27 each are arranged side-by-side. Arranging two extensions side-by-side improves the adaptation of the antenna in the direction of lower frequency ranges. In deviation from the exemplary embodiment shown, just one extension 20, 21, 22, 23 can be provided as well, laterally relative to conductor arms 13 and 14. Even single extensions results in an adaptation that improves the bandwidth of the antenna. If a very broadband operation of the antenna is not required, all extensions can be eliminated.

FIG. 2 shows that, on each corner of flat section 12, one of the extensions 24, 25, 26, 27 is bent outward above flat section 12. These outwardly-bent extensions 24, 25, 26, 27, which act as springy tabs, support radiation element 10 against dielectric plate 11, which is located beneath it (see FIG. 1). As a result, radiation element 10 is provided with a defined stable position in cavity 3, so that a possible oblique position of radiation element in housing 1—which can result from installation tolerances or imprecise assembly, for instance—is compensated.

Housing 1 can be composed of a stamped and bent piece of sheet metal, or it can be produced using die casting or injection molding. The material is produced either entirely of metal or a metallized plastic. Connector elements, for example, or other parts required for complete assembly of the radar device, can also be integrally molded on housing 1.

Figure 3:
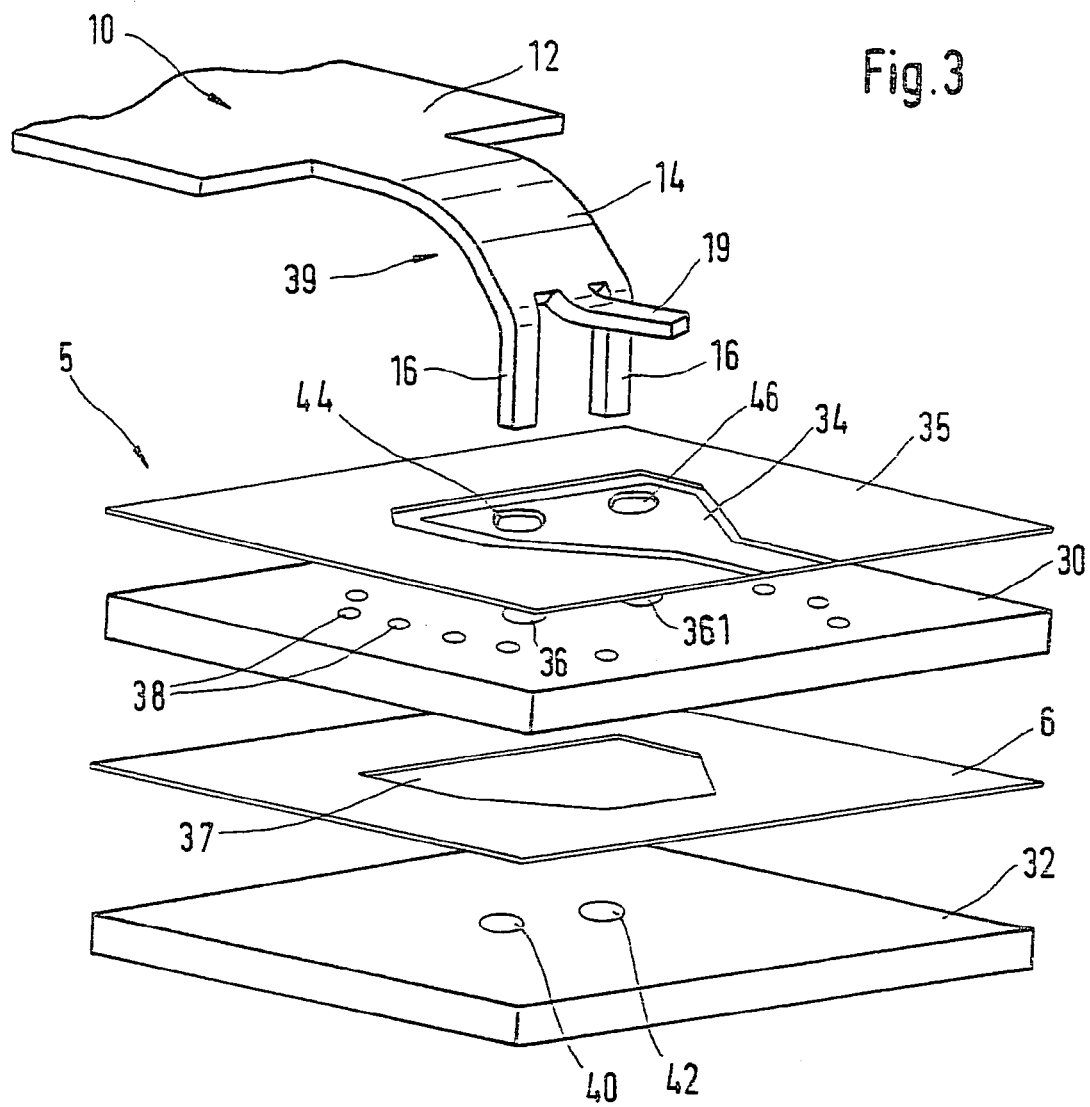
FIG. 3 is an exploded view of a transmission line of a radiation element and a multilayer printed board.

A section of a multilayer printed board 5 is shown in FIG. 3. Printed board 5 is shown in an exploded view in order to clearly show the various layers of said printed board 5. The printed board 5 shown is composed of two dielectric layers 30 and 32, for example. An inner conductor 34 and an outer conductor 35 of a coplanar conductor are mounted on the top of the first dielectric layer 30. Outer conductor 35 of the coplanar conductor is usually connected to ground. The further conductive layer 6—which is also connected to ground—is located between two dielectric layers 30 and 32. Said conductive layer 6 has a depression 37 directly underneath inner conductor 34 located on the opposite side of first dielectric layer 30. Conductive layer 6 that is located between two dielectric layers 30 and 32 is electrically connected via a plurality of feedthroughs 38 in dielectric layer 30 with outer conductor 35 of the coplanar conductor.

In deviation from the exemplary embodiment of a printed board 5 shown in FIG. 3, a printed board having more than two layers, or a printed board having just one layer, can be used in combination with the transmission line described in greater detail hereinbelow. It is not necessary, either, to have the planar conductor type shown in FIG. 3, namely the coplanar conductor, in order to use the transmission line. Any type of planar conductor that extends on a printed board (e.g., microstrip line, strip-type transmission line and the like) may be considered when using the transmission line described hereinbelow.

A transmission line 39 is shown above planar conductor 34, 35 in an exploded view in FIG. 3. The special task of said transmission line 39 is to establish an electrical connection, in particular for high-frequency signals, between planar conductor 34, 35 on printed board 5 and a circuit part, the radiation element (patch) 10 of a planar antenna. Radiation element 10 is located at a distance above printed board 5, because the antenna needs the dielectric, air, between printed board 5 and its radiation element (patch) 10 for its broadband operation.

Transmission line 39 is composed of a conductor arm 14 that is bent out of the plane of printed board 5. Conductor arm 14 is joined with radiation element 10 on its end that extends over printed board 5. Conductor arm 14 has three pins 16, 19 on its end to be contacted with planar conductor 34. Two pins 16 are oriented perpendicular to printed board 5. In contrast, the third pin 19, which is preferably located between the two pins 16 that are oriented perpendicular to printed board 5, is oriented parallel to the plane of printed board 5, i.e., it is angled perpendicular to the other two pins 16. Openings 36, 361 and 40, 42 are provided in dielectric layers 30 and 33 for the two pins 16 of conductor arm 14 that are oriented perpendicular to printed board 5, into which said openings the pins 16 of conductor arm 14 can be inserted. Likewise, depressions 44 and 46 are provided in inner conductor 34 of the coplanar conductor on dielectric layer 30, through which the pins 16 can pass into openings 36, 361, 40 and 42 of dielectric layers 30 and 32.

As shown in FIG. 2, for example, radiation element 10 has two transmission lines 39 that ensure a mechanical and electrical connection of the radiation element with printed board 5 of the arrangement via conductor arms 13 and 14.

Figure 4:
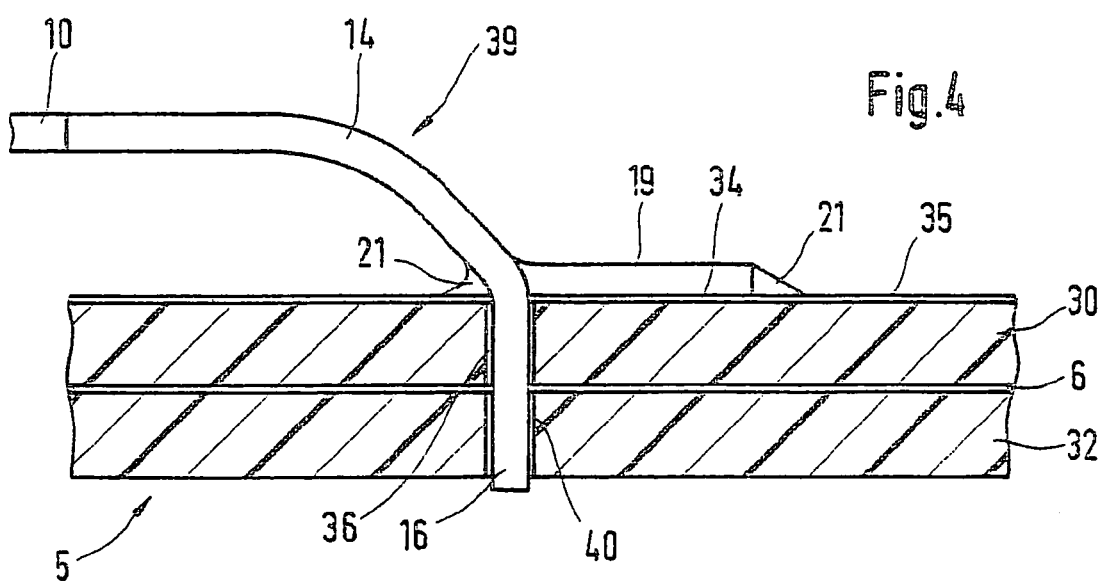
FIG. 4 is a cross-section through a multilayer printed board with a transmission line inserted therein.

The cross-section through printed board 5 shown in FIG. 4 shows a transmission line 39 inserted therein and a pin 16 on conductor arm 14, that penetrates dielectric layers 30 and 32 and conductive layer 6 located between the two. In said illustration in FIG. 4, it is also clear that the third, horizontally-extending pin 19 rests on inner conductor 34 of the coplanar conductor when conductor arm 14 is inserted in printed board 5. After transmission line 39 is inserted in printed board 5, pins 16,19 are soldered to inner conductor 34. The solder 43 remaining after the soldering process is shown in FIG. 4. Openings 36, 361, 40 and 42 in dielectric layers 30 and 32 can be through-contacted with inner conductor 34 on the top of printed board 5, by way of which a very good electrical connection is established between planar conductor 34 and transmission line 39.

Horizontally oriented pin 19 can be eliminated for the electrical connection between conductor arm 13 and 14 of transmission lines 39 and planar conductor 34, 35. In deviation from the exemplary embodiment shown, just one or more than two pins capable of being inserted in printed board 5 can be provided on conductor arm 13 and/or 14. Likewise, a plurality of horizontally-extending pins 19 lying on the planar conductor can be provided as well. Depending on the course of the planar conductor, horizontally-extending pin 19 can be angled forward, as shown in FIGS. 3 and 4, or backward relative to conductor arm 13 and/or 14, as shown in FIG. 2.

As shown in the side view of a transmission line 39 in FIG. 4 in particular, conductor arm 14 first extends from its end inserted in printed board 5 at an angle of approximately 45° relative to the plane of the printed board, and then transitions to a horizontal course. With this shape of conductor arm 14 according to the exemplary embodiment as shown in FIG. 3 and FIG. 4, a good adaptation of transmission line 14 to planar conductor 34, 35 on printed board 5 is obtained. Other shapes for transmission lines 39 are possible as well, as shown in FIG. 2, for example.

Improvements of the adaptation can be obtained by specifically configuring the width of conductor arm 14 and/or its distance from the surface of printed board 5. The width of conductor arm 13 and/or 14 can also change as the distance from the surface of the printed board increases, in order to obtain an improvement of the adaptation, as shown in the exemplary embodiment in FIG. 2, for example.

Transmission lines 39, which are composed of conductor arms 13 and/or 14 and pins 15, 16 and 19, are preferably configured as one piece. Said transmission line can be stamped out of a single piece of sheet metal, for example, and then bent into the final shape. The transmission line can also be produced as a single-component cast or compression-molded part. Transmission line 39 is composed either entirely of a conductive metal, or a plastic that is coated with a conductive layer.

What is claimed is:

1. A radar device for the detection of objects enclosed in a wall, comprising:
    a transmit and receive antenna arrangement composed of at least one cavity (3) with a radiation element (10) disposed therein, and
    a shielded chamber (2) for electrical circuits (4), whereby the shielded chamber (2) is defined by a printed board (5) covered with a housing (1), and the electrical circuits (4) are installed on the side of said printed board that faces the interior of the housing, and the antenna arrangement (3, 10) is installed on the other side,
    wherein the housing (1) is designed in such a manner that it defines both the shielded chamber (2) for the electrical circuits (4) and the at least one cavity (3) for the radiation element (10), and wherein the printed board (5) is inserted into the housing (1) between the shielded chamber (2) and the at least one cavity (3) as a shielding partition.

2. The radar device as recited in claim 1, wherein a shoulder (7) that serves as a base and for the securing of the printed board (5) is integrally molded on the housing.

3. The radar device as recited in claim 1, wherein the housing (1) includes at least one exit and entrance opening for radar beams on the side of the at least one cavity (3) that is opposite to the punted board (5), and wherein the at least one exist and entrance opening is closed with a dielectric plate (11) that is passable by the radar beams.

4. The radar device as recited in claim 1, wherein the housing (1) is configured as one piece.

5. The radar device as recited in claim 1, wherein the housing (1) is composed of metal.

6. The radar device as recited in claim 1, wherein the housing (1) is composed of a metallized plastic.

7. The radar device as recited in claim 1, wherein the printed board (5) includes at least one metallized layer (6) that acts as the shield between the shielded chamber (2) and the at least one cavity (3).

8. The radar device as recited in claim 1, wherein the radiation element (10)—located in the cavity (3)—of the at least one antenna is stamped out of sheet metal, with a flat section (12) oriented nearly parallel to the printed board (5), from which said section sheet-metal segments (13, 14), as conductor arms, are angled outwardly from two diametrically opposed edges, wherein said segments serve as transmission lines (39) for coupling the radiation element (10) to a feed network on the printed board (5) and as spacers for the flat section (12) above the printed board (5).

9. The radar device as recited in claim 8, wherein one or several springy tabs (24, 25, 26, 27) are located on the edges of the flat section (12) of the radiation element (10), wherein said tabs serve as supports for the radiation element (10) against a dielectric plate (11) that is passable by radar beams and covers said radiation element.

10. The radar device as recited in claim 8, wherein the radiation element (10) located in the at least one cavity (3) of the at least one antenna is contacted with a planar conductor (34, 35) mounted on the printed board (5) by means of the transmission lines (39).

11. The radar device as recited in claim 10, wherein the transmission lines (39) have contacting means (15, 16) that are composed of one or several pins (15, 16) extending from a conductor arm (13, 14) of the transmission lines (39), wherein said pins are oriented substantially perpendicular to a plane of the printed board and are capable of being inserted in openings (36, 361, 40, 42, 44, 46) provided therein and are capable of being contacted with the planar conductor (34, 35).

12. The radar device as recited in claim 11, wherein the contacting means (15, 16) include at least one further pin (19) that extends from the conductor arm (13, 14) and is bent perpendicular to the other pin(s) (15, 16), so that it rests on a conductive track (34) of the planar conductor (34, 35) when the conductor arm (13, 14) is inserted into the printed board (5), and is therefore contactable.

13. The radar device as recited in claim 12, wherein at least one pin (19) is provided on the conductor arm (13, 14) of the transmission lines (39) between two pins (15 and 16) that are capable of being inserted in openings (36, 361, 40, 42, 44, 46) in the printed board (5), whish wherein said one pin is bent perpendicular to said two pins.

14. The radar device as recited in claim 13, wherein the conductor arms (13, 14) of the transmission lines (39) with the contacting means (15, 16, 19) are configured as a single-component part that is made from a piece of sheet metal.

15. The radar device as recited in claim 10, wherein the electrical and mechanical connection between the printed board (5) and a planar antenna (10) located at a distance above the printed board (5) is produced by the transmission lines (39).

\* \* \* \* \*